(12) United States Patent
Liao et al.

(10) Patent No.: US 11,903,127 B2
(45) Date of Patent: Feb. 13, 2024

(54) FLUORIDE-BASED RESIN PREPREG AND CIRCUIT SUBSTRATE USING THE SAME

(71) Applicant: NAN YA PLASTICS CORPORATION, Taipei (TW)

(72) Inventors: Te-Chao Liao, Taipei (TW); Hao-Sheng Chen, Taipei (TW); Chih-Kai Chang, Taipei (TW); Hung-Yi Chang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 65 days.

(21) Appl. No.: 17/381,201

(22) Filed: Jul. 21, 2021

(65) Prior Publication Data
US 2022/0132661 A1    Apr. 28, 2022

(30) Foreign Application Priority Data
Oct. 26, 2020 (TW) .................. 109137039

(51) Int. Cl.
*H05K 1/03* (2006.01)
*B32B 27/20* (2006.01)
(Continued)

(52) U.S. Cl.
CPC ........... *H05K 1/0366* (2013.01); *B32B 27/12* (2013.01); *B32B 27/20* (2013.01); *B32B 27/322* (2013.01); *B32B 2250/03* (2013.01); *B32B 2250/24* (2013.01); *B32B 2250/40* (2013.01); *B32B 2264/101* (2013.01); *B32B 2264/104* (2013.01); *B32B 2264/107* (2013.01); *B32B 2264/301* (2020.08); *B32B 2457/08* (2013.01);
(Continued)

(58) Field of Classification Search
None
See application file for complete search history.

(56) References Cited

U.S. PATENT DOCUMENTS

| 6,620,343 B1 * | 9/2003 | Blok ........................ H01B 1/24 252/511 |
| 10,358,584 B2 * | 7/2019 | Fukushi ................. C09J 127/12 |

(Continued)

FOREIGN PATENT DOCUMENTS

| CN | 101838431 A | 9/2010 |
| CN | 101857708 A | 10/2010 |

(Continued)

OTHER PUBLICATIONS

Yang Shi-Ying, Chen Dong-Chuan, "Engineering Plastics Handbook", China Textile & Apparel Press, Aug. 31, 1994, pp. 350-351.

*Primary Examiner* — Tamra L. Dicus
(74) *Attorney, Agent, or Firm* — Li & Cai Intellectual Property Office

(57) ABSTRACT

A fluoride-based resin prepreg and a circuit substrate using the same are provided. The fluoride-based resin prepreg includes 100 PHR of a fluoride-based resin and 20 to 110 PHR of an inorganic filler. Based on a total weight of the fluoride-based resin, the fluoride-based resin includes 10 to 80 wt % of polytetrafluoroethylene (PTFE), 10 to 50 wt % of fluorinated ethylene propylene (FEP), and 0.1 to 40 wt % of perfluoroalkoxy alkane (PFA). The circuit substrate includes a fluoride-based resin substrate and a circuit layer that is formed on the fluoride-based resin substrate.

7 Claims, 3 Drawing Sheets

(51) Int. Cl.
    *B32B 27/12* (2006.01)
    *B32B 27/32* (2006.01)
(52) U.S. Cl.
    CPC .............. *H05K 2201/015* (2013.01); *H05K 2201/0275* (2013.01)

(56) References Cited

U.S. PATENT DOCUMENTS

| | | | | |
|---|---|---|---|---|
| 2003/0104270 | A1* | 6/2003 | Rubino | H01M 4/136 429/52 |
| 2006/0180936 | A1* | 8/2006 | Japp | H05K 3/4602 257/762 |
| 2008/0057333 | A1* | 3/2008 | Chu | H05K 1/0373 428/612 |
| 2013/0109790 | A1* | 5/2013 | Fukushi | C08K 5/45 524/148 |
| 2017/0226335 | A1* | 8/2017 | Okanishi | C08L 71/02 |
| 2018/0339493 | A1 | 11/2018 | Chen et al. | |

FOREIGN PATENT DOCUMENTS

| | | | |
|---|---|---|---|
| CN | 109467858 | A | 3/2019 |
| JP | 5320383 | A | 12/1993 |
| JP | 2001328205 | A | 11/2001 |
| JP | 3569197 | B2 * | 9/2004 |
| JP | 202050860 | A | 4/2020 |
| TW | 201908398 | A | 3/2019 |

\* cited by examiner

FLUORIDE-BASED RESIN PREPREG AND CIRCUIT SUBSTRATE USING THE SAME

CROSS-REFERENCE TO RELATED PATENT APPLICATION

This application claims the benefit of priority to Taiwan Patent Application No. 109137039, filed on Oct. 26, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a fluoride-based resin prepreg and a circuit substrate using the same, and more particularly to a fluoride-based resin prepreg and a circuit substrate using the same for high frequency transmission.

BACKGROUND OF THE DISCLOSURE

Generally, a smaller dielectric constant (Dk), a lower dielectric dissipation factor (Df), and a higher thermal conductivity are required for high frequency substrates to be suitable for applications in components that require high frequency transmission, such as base station antennas, satellite radars, automotive radars, wireless communication antennas, or power amplifiers.

Currently, fluoride-base resins are used in most high frequency substrates because of their low Dk and low Df. Commonly used fluoride-based resins usually include polytetrafluoroethylene (PTFE) as a main component. However, PTFE has many processing limitations that lead to difficulties in applications thereof. For example, PTFE has a higher melting point (about 327° C.) and a higher melt viscosity, such that a flowability thereof is low at the melting point.

Therefore, when multilayer circuit boards are formed by a pressing process, a temperature needs to be heated to at least 400° C., which increases processing difficulty. Moreover, in a process of manufacturing printed circuit boards with high density circuits, the low flowability and a low filling property of PTFE may lead to porosity between circuit layers of the printed circuit boards and the fluoride-based resins. During subsequent printed circuit board processing or heat treatment, the aforementioned porosity further increases a negative impact on a difference in thermal expansion coefficient between the circuit layer and the fluoride-based resin, thereby affecting a yield of the printed circuit board.

Accordingly, improving a formulation of the fluoride-based resin to reduce the processing temperature, while at the same time improving both the flowability and the filling property are still issues worth addressing in the related art.

SUMMARY OF THE DISCLOSURE

In response to the above-referenced technical inadequacies, the present disclosure provides a fluoride-based resin prepreg and a circuit substrate using the same to improve a flowability and a filling property of the fluoride-based resin prepreg during pressing, so as to be suitable for manufacture of a high frequency circuit substrate.

In one aspect, the present disclosure provides a fluoride-based resin prepreg. The fluoride-based resin prepreg includes a reinforced base layer and a fluoride-based resin layer. The fluoride-based resin layer covers the reinforced base layer, and the fluoride-based resin layer includes 100 PHR of a fluoride-based resin and 20 to 110 PHR of an inorganic filler. Based on a total weight of the fluoride-based resin, the fluoride-based resin includes 10 to 80 wt % of polytetrafluoroethylene (PTFE), 10 to 50 wt % of fluorinated ethylene propylene (FEP), and 0.1 to 40 wt % of perfluoroalkoxy alkane (PFA).

In another aspect, the present disclosure provides a circuit substrate. The circuit substrate includes the above-mentioned fluoride-based resin substrate and a circuit layer. The circuit layer is disposed on the fluoride-based resin substrate.

Therefore, one of the beneficial effects of the present disclosure is that the fluoride-based resin prepreg and the circuit substrate using the same provided by the present disclosure has a lower pressing temperature, and a better flowability as well as a better filling property, by virtue of "the fluoride-based resin including 10 to 80 wt % of PTFE, 10 to 50 wt % of FEP, and 0.1 to 40 wt % of PFA". Accordingly, such a fluoride-based resin prepreg is suitable for the high frequency circuit substrate, and more particularly for the manufacture of the circuit substrate with high density circuits.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
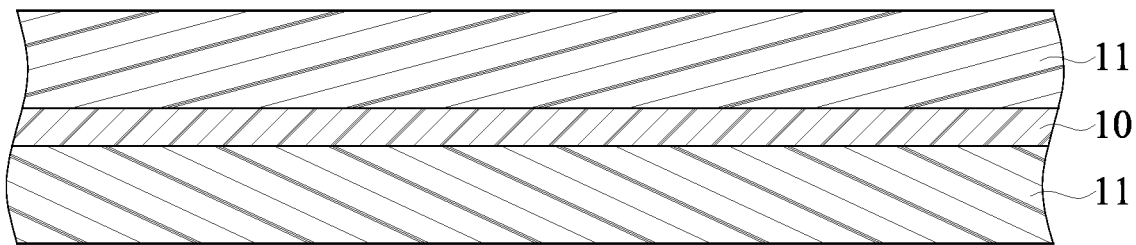
FIG. 1 is a partial schematic sectional view of a fluoride-based resin prepreg according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a partial schematic sectional view of a fluoride-based resin prepreg according to one embodiment of the present disclosure. The present disclosure provides a fluoride-based resin prepreg 1, which includes a reinforced base layer 10 and a fluoride-based resin layer 11.

The reinforced base layer 10 is made of glass fiber, carbon fiber, graphite fiber, alumina fiber, silicon carbide fiber, silicon nitride fiber, boron fiber, or a combination thereof. In one preferred embodiment, the reinforced base layer 10 is a glass fiber cloth, and a thickness of the reinforced base layer 10 is from 20 to 100 μm.

In the present embodiment, the reinforced base layer 10 is completely covered by the fluoride-based resin layer 11. Specifically speaking, the fluoride-based resin layers 11 can be formed on opposite sides of the reinforced base layer 10, can sandwich the reinforced base layer 10 therebetween (as shown in FIG. 1), or can completely cover the reinforced base layer 10.

A method of forming the fluoride-based resin prepreg 1 can be performed by repeatedly immersing the reinforced base layer 10 in a fluoride-based resin composition solution. In addition, after each immersing process, the immersed reinforced base layer 10 is heated to high temperature and then dried to form the fluoride-based resin layer 11 with a predetermined thickness. In one embodiment, a thickness of the fluoride-based resin layer 11 is from 30 to 200 μm. However, the present disclosure does not limit a way in which the fluoride-based resin prepreg 1 can be made. In another embodiment, the fluoride-based resin layer 11 can be formed by coating the reinforced base layer 10 with the fluoride-based resin composition solution.

Furthermore, the fluoride-based resin layer 11 includes 100 PHR of a fluoride-based resin and 20 to 110 PHR of an inorganic filler. In one preferred embodiment, the fluoride-based resin layer 11 includes 80 to 110 PHR of the inorganic filler.

In one embodiment, based on a total weight of the fluoride-based resin, the fluoride-based resin includes 10 to 80 wt % of polytetrafluoroethylene (PTFE), 10 to 50 wt % of fluorinated ethylene propylene (FEP), and 0.1 to 40 wt % of perfluoroalkoxy alkane (PFA).

It should be noted that, in a pressing process, a greater amount of PTFE in the fluoride-based resin prepreg 1 causes a flowability of the fluoride-based resin prepreg 1 to be worse, and a pressing temperature required for pressing to be higher. In addition, a lower content of FEP causes a reduction of the flowability of the fluoride-based resin prepreg 1, but an excessive content of FEP sacrifices dielectric properties of the fluoride-based resin prepreg 1, which is unfavorable to an application of a circuit substrate for high frequency transmission.

A lower content of PFA affects the flowability of the fluoride-based resin prepreg 1, but an excessive content of PFA causes the pressing temperature required for pressing the fluoride-based resin prepreg 1 to be higher. Accordingly, in the present embodiment, the pressing temperature and the flowability of the fluoride-based resin prepreg 1 are adjusted through PTFE in cooperation with FEP and PFA.

When manufacturing circuit substrates with high density interconnect (HDI), a line width or a line distance between a plurality of lines of a circuit layer is narrow, which is usually 3 mil or less. Therefore, the flowability required for the fluoride-based resin prepreg 1 is higher. In one preferred embodiment, 50 to 70 wt % of PTFE, 0.1 to 40 wt % of FEP, and 1 to 20 wt % PFA in the fluoride-based resin are used for manufacturing the circuit substrates with high density interconnect.

In one preferred embodiment, the fluoride-based resin further includes ethylene-tetra-fluoro-ethylene (ETFE). Moreover, the fluoride-based resin includes 10 to 80 wt % of PTFE, 10 to 50 wt % of FEP, 0.1 to 40 wt % of PFA, and 0.1 to 5 wt % of ETFE.

ETFE can enhance a processability of the fluoride-based resin layer 11. Moreover, an addition of ETFE can further reduce the pressing temperature of the fluoride-based resin layer 11. In addition, the addition of ETFE can improve a tensile strength of the fluoride-based resin layer 11.

In one embodiment, the inorganic filler is silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium oxide, or any combination thereof.

Silicon dioxide can be fused silicon dioxide or crystalline silicon dioxide, and fused silicon dioxide is preferred when considering dielectric properties of an overall copper foil substrate. Titanium dioxide can be rutile titanium dioxide, anatase titanium dioxide, or brookite titanium dioxide, and rutile titanium dioxide is preferred when considering the dielectric properties of the circuit substrate.

In addition, in one embodiment, the inorganic filler is an inorganic powder, and an average particle size of the inorganic powder is between 0.01 and 20 μm. It should be noted that a content of the inorganic powder that exceeds 60 PHR relative to the fluoride-based resin may affect a suspension of the resin composition, which causes poor homogeneity of the prepreg due to precipitation during the immersing process, and causes difficulties in the process.

In one preferred embodiment, the fluoride-based resin prepreg 1 further includes 0.1 to 5 PHR of a processing agent. The processing agent can include, but is not limited to, a dispersing agent, a wetting agent, a deforming agent, etc. In one embodiment, the processing agent is hydroxyethyl cellulose, nitrocellulose, polymethyl styrene, polymethyl methacrylate, polyethylene glycol, or any combination thereof.

Based on the above-mentioned, the fluoride-based resin prepreg 1 according to the one embodiment of the present disclosure can have the lower pressing temperature and the better flowability. In one embodiment, when the fluoride-based resin prepreg 1 according to the one embodiment of the present disclosure is used for manufacturing the circuit substrate, the pressing temperature is about 240° C. to 300° C.

The flowability of the fluoride-based resin prepreg 1 according to the one embodiment of the present disclosure is from 5 to 16% after being subject to the IPC-TM-650-2.3.17 test method. In addition, the fluoride-based resin prepreg 1 according to the one embodiment of the present disclosure also has a low dissipation factor (Df) and a low dielectric constant (Dk), such that requirements of circuit substrates for transmitting high frequency signals can be met.

The fluoride-based resin prepreg 1 according to the present disclosure has been shown to have the high flowability and the low pressing temperature without sacrificing too much of the Df and dielectric properties. The following table shows physical properties of the fluoride-based resin prepreg 1 in different Examples and Comparative Examples according to the present disclosure, and composition of the fluoride-based resin prepreg 1 in each Examples and Comparative Examples. The physical properties are measured by the following methods.

6. Pressing Temperature

Hot pressing is performed using a vacuum hot press machine. Temperature of each of an upper plate and a lower plate of the vacuum hot press machine is adjusted to be at a predetermined temperature before pressing. The pressing time is 120 minutes. The pressing temperature is a temperature required for the fluoride-based resin prepreg 1 to achieve the required flowability and to completely bond to the copper foil.

Table 1 shows the composition and the physical properties evaluation of the fluoride-based resin substrate in Examples 1 to 5 and in Comparative Examples 1 to 3. The composition of the fluoride-based resin substrate in Examples 1 to 5 each includes 49.5 wt % of the fluoride-based resin, 50 wt % of the inorganic filler, and 0.5 wt % of the processing agent. The composition of the fluoride-based resin substrate in Example 6 includes 67.3 wt % (100 PHR) of the fluoride-based resin, 16.7 wt % (about 20 PHR) of the inorganic filler, and 0.8 wt % of the processing agent. The composition of the fluoride-based resin substrate in Example 7 includes 55.5 wt % (100 PHR) of the fluoride-based resin, 44 wt % (about 80 PHR) of the inorganic filler, and 0.56 wt % of the processing agent.

|  |  | Example |  |  |  |  |  |  | Comparative Example |  |  |
|---|---|---|---|---|---|---|---|---|---|---|---|
|  |  | 1 | 2 | 3 | 4 | 5 | 6 | 7 | 1 | 2 | 3 |
| Fluoride-based resin | PTFE | 25% | 25% | 20% | 20% | 25% | 41.7% | 28% | 50% | 30% | 30% |
|  | PFA | 15% | 9% | 20% | 9% | 15% | 25% | 16.8% | 0% | 0% | 20% |
|  | FEP | 9% | 15% | 9% | 20% | 9.5% | 15% | 10.1% | 0% | 20% | 0% |
|  | ETFE | 0.5% | 0.5% | 0.5% | 0.5% | 0% | 0.8% | 0.56% | 0% | 0% | 0% |
| Inorganic filler | $SiO_2$ | 50% | 50% | 50% | 30% | 50% | 0 | 44% | 50% | 50% | 50% |
|  | $TiO_2$ | 0 | 0 | 0% | 20% | 0 | 16.7% | 0 | 0% | 0 | 0 |
| Processing agent | Polyethylene glycol | 0.5% | 0.5% | 0.5% | 0.5% | 0.5% | 0.8% | 0.56% | 0% | 0% | 0% |
| Thickness of fluoride-based resin layer (μm) |  | 90 | 90 | 70 | 70 | 70 | 90 | 90 | 90 | 90 | 90 |
| Physical properties evaluation |  |  |  |  |  |  |  |  |  |  |  |
| Thermal conductivity coefficient (W/mK) |  | 0.54 | 0.56 | 0.55 | 0.52 | 0.53 | 0.33 | 0.48 | 0.51 | 0.5 | 0.51 |
| Dielectric constant (10 GHz) |  | 3.44 | 3.46 | 3.49 | 3.85 | 3.45 | 3.45 | 3.43 | 3.42 | 3.45 | 3.44 |
| Dissipation factor (10 GHz) |  | 0.0015 | 0.0018 | 0.0017 | 0.0019 | 0.0016 | 0.0018 | 0.0015 | 0.0016 | 0.0025 | 0.0018 |
| Flowability (%) |  | 8% | 13% | 11% | 15% | 4% | 16% | 12% | 0% | 25% | 4% |
| Peeling strength (lb/in) |  | 6.8 | 7.5 | 7.4 | 7.2 | 4.5 | 7.8 | 6.8 | 4.2 | 6.9 | 4.1 |
| Pressing temperature |  | 360° C. | 330° C. | 355° C. | 310° C. | 375° C. | 308° C. | 318° C. | 428° C. | 400° C. | 395° C. |

1. Thermal Conductivity Analysis and Test

A thermal conductivity analysis and test was performed using an interface material thermal resistance and thermal conductivity coefficient measuring instrument (Long Win Science and Technology Corporation, LW-9389) according to the ASTM-D5470 test method.

2. Dielectric Constant (10 GHz)

A dielectric analyzer (HP Agilent E4991A) was used to measure the samples in dielectric constant at 10 GHz.

3. Dissipation Factor (10 GHz)

A dielectric analyzer (HP Agilent E4991A) was used to measure the samples in dissipation factor at 10 GHz.

4. Peeling Strength Test

A peeling strength of a copper foil substrate is measured according to the IPC-TM-650-2.4.8 test method.

5. Flowability Test

A flowability of the fluoride-based resin prepreg is measured according to the IPC-TM-650-2.3.17 test method.

Reference is made to Example 1 and Example 2 according to a result of Table 1, in which, when the percentage of FEP increases from 9% to 15%, although the Df increases slightly (from 0.0015 to 0.0018), the pressing temperature is significantly reduced from 360° C. to 330° C.

Moreover, reference is made to Example 1 and Example 3, in which a decrease of a proportion of PTFE and an increase of a proportion of PFA can cause a slight decrease of the pressing temperature and an improvement of the flowability. Reference is made to Example 1 and Example 2, in which, compared to Example 1, the proportion of PFA is decreased and a proportion of FEP is increased when the proportion of PTFE is fixed in Example 2. Comparing the Df, the flowability and the pressing temperature in Example 1 and Example 2, the flowability is significantly increased and the pressing temperature is significantly reduced to 330° C. in Example 2. Although the Df in Example 2 is slightly increased, such a fluoride-based resin substrate can still be applied to the manufacture of high frequency substrates.

Reference is made to Example 2 and Example 4, in which, compared to Example 2, the proportion of PTFE is decreased and the proportion of FEP is further increased, such that the flowability is increased to 15% and the pressing temperature is effectively reduced to 310° C. in Example 4. Nevertheless, the Df in Example 4 is not significantly increased compared to Example 2, and such a fluoride-based resin substrate can still be applied to the manufacture of high frequency substrates.

It can be observed in Comparative Example 1 that the pressing temperature is 428° C. and there is no flowability in the absence of FEP and PFA. It can be observed in Comparative Example 2 that the Df is too high to be applied in an ultra-high frequency field in the presence of adding only FEP. In addition, it can be observed in Comparative Example 3 that the electrical properties are good, while the flowability is still insufficient in the presence of adding only PFA.

Compared to Comparative Examples 1 to 3, the pressing temperatures in Examples 1 to 7 are significantly reduced. Reference is further made to Examples 1 and 5, in which, compared to Example 1, no ETFE is added in Example 5. Comparing the pressing temperatures in Examples 1 and 5, it can be observed that the pressing temperature in Example 1 is lower. That is to say, although the addition of PTFE, PFA, and FEP in the fluoride-based resin can significantly reduce the pressing temperature, the addition of ETFE therein can further reduce the pressing temperature.

In addition, reference is made to Example 6, in which the lower pressing temperature and the better flowability can be obtained when the fluoride-based resin is about 67.3 wt % (100 PHR) and the inorganic filler is 16.7 wt % (about 20 PHR). In addition, reference is made to Example 7, in which the lower Df (0.0015) and the relatively lower pressing temperature (318° C.) can be obtained when the fluoride-based resin is about 55.5 wt % (100 PHR) and the inorganic filler is 16.7 wt % (about 80 PHR).

First Embodiment

Figure 2:
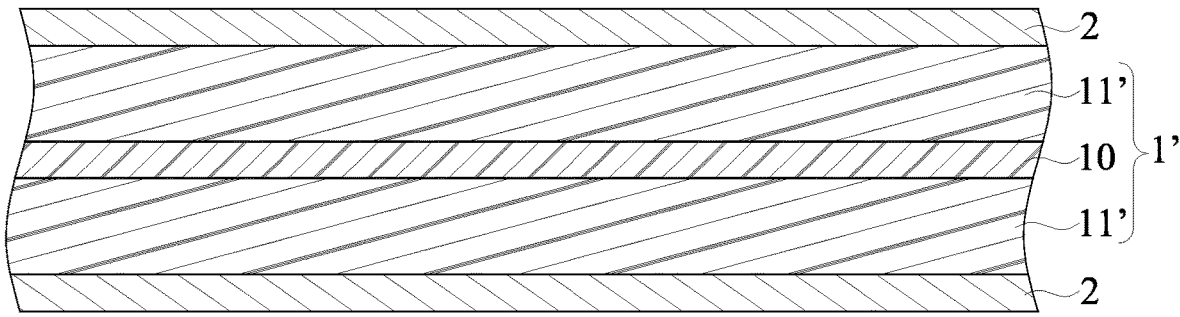
FIG. 2 is a partial schematic sectional view of a circuit substrate according to a first embodiment of the present disclosure.

Referring to FIG. 2, FIG. 2 is a partial schematic sectional view of a circuit substrate according to a first embodiment of the present disclosure. A circuit substrate P1 includes a fluoride-based resin substrate 1' and a circuit layer 2 that is disposed on the fluoride-based resin substrate 1'.

In the circuit substrate P1 according to the present embodiment, two of the circuit layers 2 are correspondingly disposed on two sides of the fluoride-based resin substrate 1' that are opposite to each other. However, in another embodiment, the circuit layer 2 can also be disposed on one side of the fluoride-based resin substrate 1'.

In addition, the circuit layer 2 can be an unetched copper foil layer, or a patterned copper foil layer that is formed by etching. In the present embodiment, the two of the circuit layers 2 that are respectively disposed on the two sides of the fluoride-based resin substrate 1' are both the unetched copper foil layers. In another embodiment, the at least one circuit layer 2 is the pattern copper foil layer.

It should be noted that the circuit substrate P1 according to the present embodiment is manufactured using the aforementioned fluoride-based resin prepreg 1 as an electrically insulating layer. That is to say, the aforementioned fluoride-based resin prepreg 1 is pressed and cured to form the fluoride-based resin substrate 1' of the circuit substrate P1. Accordingly, the fluoride-based resin substrate 1' of the circuit substrate P1 has the same composition as the fluoride-based resin prepreg 1.

That is to say, the fluoride-based resin substrate 1' includes the reinforced base layer 10 and a fluoride-based resin layer 11' that covers the reinforced base layer 10. The reinforced base layer 10 is made of glass fiber, carbon fiber, graphite fiber, alumina fiber, silicon carbide fiber, silicon nitride fiber, boron fiber, or a combination thereof. In the present embodiment, the reinforced base layer 10 is a glass fiber cloth.

The fluoride-based resin layer 11' includes 100 PHR of the fluoride-based resin and 20 to 60 PHR of the inorganic filler. The fluoride-based resin includes 10 to 80 wt % of PTFE, 10 to 50 wt % of FEP, and 0.1 to 40 wt % of PFA.

In one embodiment, the inorganic filler is an inorganic powder, and an average particle size of the inorganic powder is between 0.01 and 20 μm. The inorganic filler is silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium oxide, or any combination thereof.

In one embodiment, the fluoride-based resin further includes 0.1 to 5 wt % of ETFE. Specifically speaking, the pressing temperature for manufacturing the circuit substrate P1 can be further reduced when the fluoride-based resin prepreg 1 includes a specific percentage of ETFE.

In one embodiment, in a pressing process, i.e., pressure is continuously exerted at high temperature and high pressure on at least one copper foil layer and at least one of the fluoride-based resin prepreg 1, so as to bond the at least one copper foil layer and the at least one of the fluoride-based resin prepreg 1 to each other. After the pressure is cooled down, the at least one copper foil layer and the at least one of the fluoride-based resin prepreg 1 are connected to each other to form the circuit substrate P1. It should be noted that a ratio of the fluoride-based resin in the fluoride-based resin prepreg 1 according to the one embodiment of the present disclosure can cause a reduction of the pressing temperature and an improvement of the flowability of the fluoride-based resin prepreg 1 when being compared with conventional prepregs. In one embodiment, the pressing temperature is from 240° C. to 360° C.

Second Embodiment

Figure 3:
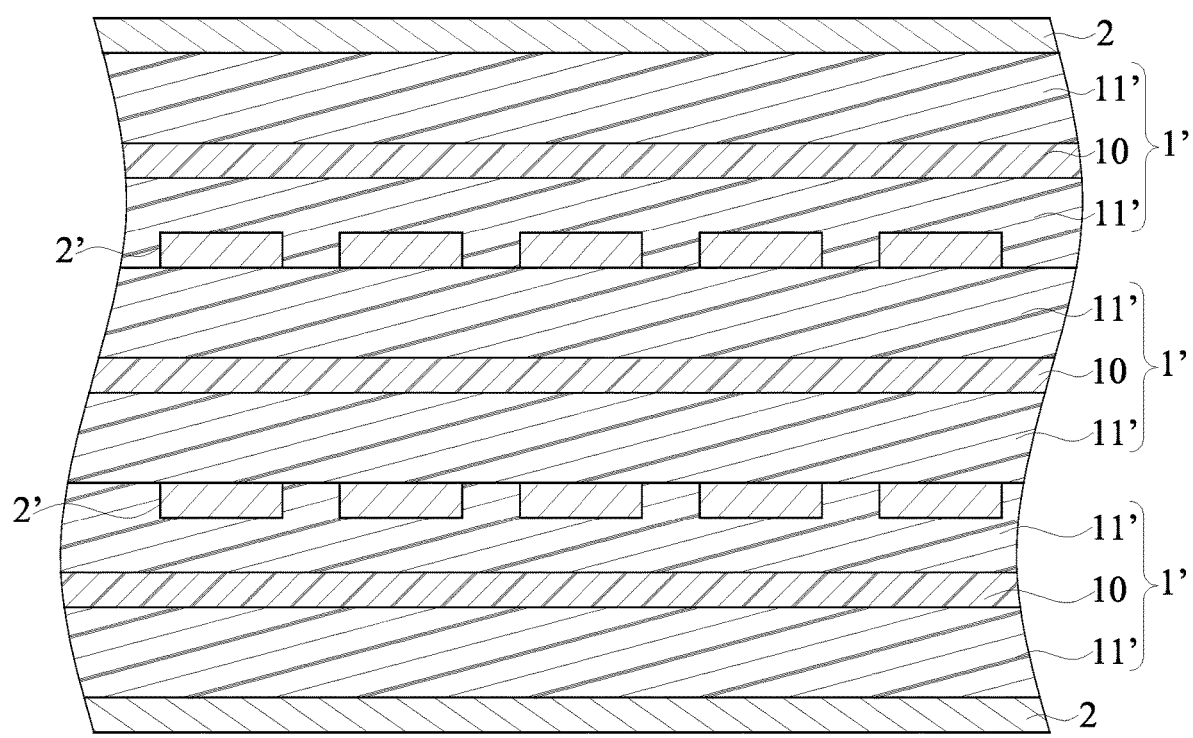
FIG. 3 is a partial schematic sectional view of a circuit substrate according to a second embodiment of the present disclosure.

In addition, the fluoride-based resin prepreg 1 according to one embodiment of the present disclosure has better flowability, such that the same can be applied to manufacture the circuit substrate with high density interconnect. Referring to FIG. 3, FIG. 3 is a partial schematic sectional view of a circuit substrate according to a second embodiment of the present disclosure.

In the present embodiment, a circuit substrate P2 includes a plurality of fluoride-based resin substrates 1' and a plurality of circuit layers 2, 2', and the plurality of fluoride-based resin substrates 1' and the plurality of circuit layers 2, 2' are alternately stacked with one another. In the present embodiment, two of the circuit layers 2' are pattern copper foil layers, and another two of the circuit layers 2 are unetched copper foil layers. In one embodiment, the circuit substrate P2 is a circuit substrate with high density circuit layers. That is to say, the circuit layer 2' is the high density circuit layer, and line distances between a plurality of circuits are each 3 mil or less, or a line width of each of the circuits is 3 mil or less. In the manufacturing process of the circuit substrate P2, the fluoride-based resin prepreg 1 can be laminated to the pattern copper foil layer (e.g., the circuit layers 2') for lamination. Since the line distances between the circuits are small, the higher flowability of the fluoride-based resin prepreg 1 is required. The fluoride-based resin prepreg 1 according to embodiments of the present disclosure has better flowability and can be filled into spaces of the circuit layer 2'. In one preferred embodiment, the fluoride-based resin includes 50 to 70 wt % of PTFE, 15 to 30 wt % of FEP, and 1 to 20 wt % of PFA.

Accordingly, the spaces are less likely to be formed between the fluoride-based resin substrate 1' and the circuit layer 2' in the circuit substrate P2, such that the fluoride-based resin substrate 1' cannot be peeled off from the circuit layer 2' due to a difference in a thermal expansion coefficient between the circuit layer 2' and the fluoride-based resin substrate 1', and the space formed therebetween can be avoided during the subsequent processing. That is to say, the fluoride-based resin prepreg 1 according to the embodiments of the present disclosure has better flowability, so that a reliability of the circuit substrate P2 can be further improved.

BENEFICIAL EFFECTS OF THE EMBODIMENTS

In conclusion, one of the beneficial effects of the present disclosure is that the fluoride-based resin prepreg 1 and the circuit substrate using the same provided by the present disclosure has lower pressing temperature, and better flowability as well as better filling property, by virtue of "the fluoride-based resin including 10 to 80 wt % of PTFE, 10 to 50 wt % of FEP, and 0.1 to 40 wt % of PFA". Accordingly, a process difficulty of the circuit substrate can be reduced when the fluoride-based resin prepreg 1 according to the embodiments of the present disclosure is applied to the manufacture of the circuit substrate. Moreover, the fluoride-based resin prepreg 1 according to the embodiments of the present disclosure is particularly suitable for the manufacture of the circuit substrate with high density circuits due to the better flowability thereof.

Furthermore, the circuit substrates P1, P2 that are manufactured using the fluoride-based resin prepreg 1 according to the embodiments of the present disclosure can be used for high frequency transmission and have higher reliability.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated.

Alternative embodiments will become apparent to those skilled in the art to which the present disclosure pertains without departing from its spirit and scope.

What is claimed is:

1. A fluoride-based resin prepreg, consisting of:
   a reinforced base layer; and
   a fluoride-based resin layer covering the reinforced base layer;
   wherein the fluoride-based resin layer includes 100 PHR of a fluoride-based resin and 20 to 110 PHR of an inorganic filler;
   wherein based on a total weight of the fluoride-based resin, the fluoride-based resin consisting of 10 to 80 wt % of polytetrafluoroethylene (PTFE), 10 to 50 wt % of fluorinated ethylene propylene (FEP), and 0.1 to 40 wt % of perfluoroalkoxy alkane (PFA), and 0.1 to 5 wt % of ethylene-tetra-fluoro-ethylene (ETFE);
   wherein a flowability of the fluoride-based resin prepreg is 4-16% and a pressing temperature of the fluoride-based resin prepreg is 308-375° C.

2. The fluoride-based resin prepreg according to claim 1, wherein the inorganic filler is an inorganic powder, an average particle size of the inorganic powder is between 0.01 and 20 pm, and the inorganic filler is silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium oxide, or any combination thereof.

3. The fluoride-based resin prepreg according to claim 1, wherein the reinforced base layer is made of glass fiber, carbon fiber, graphite fiber, alumina fiber, silicon carbide fiber, silicon nitride fiber, boron fiber, or a combination thereof.

4. The fluoride-based resin prepreg according to claim 1, wherein a thickness of the reinforced base layer is from 20 to 100 μm.

5. The fluoride-based resin prepreg according to claim 1, wherein a thickness of the fluoride-based resin layer is from 30 to 200 μm.

6. The fluoride-based resin prepreg according to claim 1, wherein a flowability of the fluoride-based resin prepreg is 5 to 15%.

7. The fluoride-based resin prepreg according to claim 1, further comprising 0.1 to 5 PHR of a processing agent; wherein the processing agent is hydroxyethyl cellulose, nitrocellulose, polymethyl styrene, polymethyl methacrylate, polyethylene glycol, or any combination thereof.

* * * * *